(12) United States Patent
Shimoda et al.

(10) Patent No.: US 9,293,257 B2
(45) Date of Patent: Mar. 22, 2016

(54) SOLID-STATE ELECTRONIC DEVICE INCLUDING DIELECTRIC BISMUTH NIOBATE FILM FORMED FROM SOLUTION

(71) Applicant: Japan Science and Technology Agency, Saitama (JP)

(72) Inventors: Tatsuya Shimoda, Ishikawa (JP); Eisuke Tokumitsu, Ishikawa (JP); Masatoshi Onoue, Chicago, IL (US); Takaaki Miyasako, Mie (JP)

(73) Assignee: Japan Science and Technology Agency, Saitama (JP)

( * ) Notice: Subject to any disclaimer, the term of this patent is extended or adjusted under 35 U.S.C. 154(b) by 0 days.

(21) Appl. No.: 14/357,167

(22) PCT Filed: Oct. 25, 2012

(86) PCT No.: PCT/JP2012/077623
§ 371 (c)(1),
(2) Date: May 8, 2014

(87) PCT Pub. No.: WO2013/069470
PCT Pub. Date: May 16, 2013

(65) Prior Publication Data
US 2014/0319660 A1    Oct. 30, 2014

(30) Foreign Application Priority Data

Nov. 9, 2011    (JP) ................. 2011-245915

(51) Int. Cl.
*C01G 29/00*    (2006.01)
*C01G 33/00*    (2006.01)
(Continued)

(52) U.S. Cl.
CPC ........... *H01G 4/1254* (2013.01); *H01G 4/1263* (2013.01); *H01G 4/306* (2013.01);
(Continued)

(58) Field of Classification Search
CPC ....................................................... H01L 28/55
See application file for complete search history.

(56) References Cited

U.S. PATENT DOCUMENTS

2003/0008522 A1    1/2003  Endisch et al.
2006/0140031 A1*   6/2006  Kijima et al. ................. 365/202
(Continued)

FOREIGN PATENT DOCUMENTS

JP    10-173140 A     6/1998
JP    2003-509846 A   3/2003
(Continued)

OTHER PUBLICATIONS

Ren, Wei, et al. "Bismuth zinc niobate pyrochlore dielectric thin films for capacitive applications." Journal of applied physics 89.1 (2001): 767-774.*
(Continued)

*Primary Examiner* — Colleen A Matthews
*Assistant Examiner* — Regan J Rundio
(74) *Attorney, Agent, or Firm* — Seed IP Law Group PLLC

(57) ABSTRACT

A solid-state electronic device according to the present invention includes: an oxide layer (possibly containing inevitable impurities) that is formed by heating, in an atmosphere containing oxygen, a precursor layer obtained from a precursor solution as a start material including both a precursor containing bismuth (Bi) and a precursor containing niobium (Nb) as solutes, the oxide layer consisting of the bismuth (Bi) and the niobium (Nb); wherein the oxide layer is formed by heating at a heating temperature from 520° C. to 650° C.

11 Claims, 14 Drawing Sheets

(51) Int. Cl.
*H01G 4/30* (2006.01)
*H01G 4/12* (2006.01)
*B05D 5/12* (2006.01)
*H01L 21/02* (2006.01)
*H01L 29/84* (2006.01)
*H01L 49/02* (2006.01)
*H01L 27/01* (2006.01)
*B81C 1/00* (2006.01)
*B81B 7/00* (2006.01)
*H01L 21/768* (2006.01)
*H01L 21/316* (2006.01)

(52) U.S. Cl.
CPC .... *H01L21/02205* (2013.01); *H01L 21/02288* (2013.01); *H01L 27/016* (2013.01); *H01L 28/40* (2013.01); *H01L 29/84* (2013.01); *H01L 21/02282* (2013.01); *H01L 21/31691* (2013.01); *H01L 21/76817* (2013.01)

(56) References Cited

U.S. PATENT DOCUMENTS

| 2006/0208823 | A1* | 9/2006 | Hunt et al. | 333/24 C |
| 2008/0193642 | A1* | 8/2008 | Yoon et al. | 427/248.1 |
| 2010/0022032 | A1 | 1/2010 | Takiguchi et al. | |
| 2013/0022839 | A1 | 1/2013 | Kijima et al. | |

FOREIGN PATENT DOCUMENTS

| JP | 2005-116421 A | 4/2005 |
| JP | 2008-147632 A | 6/2008 |
| WO | 2011-089748 A1 | 7/2011 |

OTHER PUBLICATIONS

International Search Report, mailed Dec. 11, 2012, for PCT/JP2012/077623, 4 pages.

* cited by examiner

SOLID-STATE ELECTRONIC DEVICE INCLUDING DIELECTRIC BISMUTH NIOBATE FILM FORMED FROM SOLUTION

TECHNICAL FIELD

The present invention relates to a solid-state electronic device.

BACKGROUND ART

There has been conventionally developed a thin film capacitor exemplifying a solid-state electronic device and including a ferroelectric thin film that possibly enables high speed operation. Metal oxide is now often considered as a dielectric material included in a capacitor, and the sputtering technique is widely adopted as a method of forming the ferroelectric thin film (Patent Document 1).

PRIOR ART DOCUMENT

Patent Document

Patent Document 1: JP 10-173140 A

SUMMARY OF THE INVENTION

Problems to be Solved by the Invention

However, it is generally necessary to bring the inside of a film forming chamber into a high vacuum state in order to achieve fine film quality in the sputtering technique. The vacuum process or the photolithography technique other than the sputtering technique also typically requires relatively long time and/or expensive equipment. These processes lead to quite low utilization ratios of raw materials and production energy. When adopting the production method described above, production of a solid-state electronic device requires many steps and long time, which is not preferred from the industrial and mass productivity perspectives. The conventional technique also causes the problem that increase in area is relatively difficult to achieve.

Selection of a material having the high properties as an insulating layer of a solid-state electronic device, which is produced in accordance with an excellent method from the industrial and mass productivity perspectives, is thus also one of the technical objects to be achieved for improvement in performance of the solid-state electronic device.

The present invention achieves this object to enable simplification and energy saving in a process of producing a solid-state electronic device. The present invention thus contributes remarkably to provision of a solid-state electronic device that is excellent from the industrial and mass productivity perspectives.

Solutions to the Problems

The inventors of this application have gone through intensive researches on oxide that can be included in a solid-state electronic device such as a capacitor or a thin film capacitor as well as can be formed even in accordance with an inexpensive and simple method. The inventors have found, through many trials and tests, that a specific oxide material replacing conventionally and widely adopted oxide is relatively inexpensive, simplifies the production steps, has relatively high insulation and relative permittivity, and can be included also in a solid-state electronic device. The inventors have also found that the oxide enables patterning in accordance with an inexpensive and simple method adopting the "imprinting" technique also called "nanoimprinting". The inventors thus found that it is possible to form a layer of the oxide and produce a solid-state electronic device including such oxide layers in accordance with a process that achieves remarkable simplification or energy saving as well as facilitates increase in area in comparison to the conventional technique. The present invention has been devised in view of these points.

A solid-state electronic device according to a first aspect includes: an oxide layer (possibly containing inevitable impurities) that is formed by heating, in an atmosphere containing oxygen, a precursor layer obtained from a precursor solution as a start material including both a precursor containing bismuth (Bi) and a precursor containing niobium (Nb) as solutes, the oxide layer consisting of the bismuth (Bi) and the niobium (Nb); wherein the oxide layer is formed by heating at a heating temperature from 520° C. to 650° C.

In the solid-state electronic device according to a second aspect, the oxide layer has a carbon content percentage of at most 1.5 atm %.

In the solid-state electronic device according to a third aspect, the precursor layer is provided with an imprinted structure by imprinting the precursor layer while the precursor layer is heated at a temperature from 80° C. to 300° C. in an atmosphere containing oxygen before the oxide layer is formed.

In the solid-state electronic device according to a fourth aspect, the imprinting is performed with a pressure in a range from 1 MPa to 20 MPa.

In the solid-state electronic device according to a fifth aspect, the imprinting is performed using a mold that is preliminarily heated to a temperature in a range from 80° C. to 300° C.

The solid-state electronic device according to a sixth aspect is a capacitor.

The solid-state electronic device according to a seventh aspect is a semiconductor device.

The solid-state electronic device according to an eighth aspect is a MEMS device.

Effects of the Invention

In the solid-state electronic device according to the first aspect, the oxide layer can be formed through a relatively simple process not in accordance with the photolithography technique (but in accordance with the ink jet technique, the screen printing technique, the intaglio/relief printing technique, or the nanoimprinting technique). There is thus no need to include a process requiring relatively long time and/or expensive equipment, such as the vacuum process, a process in accordance with the photolithography technique, or the ultraviolet irradiation process. Moreover, the oxide layer is formed through heat treatment at a relatively low temperature with no need for any of the above processes. The solid-state electronic device is thus excellent from the industrial and mass productivity perspectives.

The solid-state electronic device according to the second aspect achieves decrease in leakage current.

In the solid-state electronic device according to the third aspect, deterioration in plastic deformability of each precursor layer can be prevented quite reliably during imprinting, so that the desired imprinted structure can be formed with higher accuracy.

In the solid-state electronic device according to the fourth aspect, the desired imprinted structure can be formed with high accuracy. Furthermore, the pressure applied for imprinting is in such a low range from 1 MPa to 20 MPa. The mold is thus less likely to be damaged upon imprinting and increase in area can be also achieved advantageously.

As the solid-state electronic device according to the sixth aspect, it is possible to provide the capacitor that is excellent from the industrial and mass productivity perspectives.

As the solid-state electronic device according to the seventh aspect, it is possible to provide the semiconductor device that is excellent from the industrial and mass productivity perspectives.

As the solid-state electronic device according to the eighth aspect, it is possible to provide the MEMS device that is excellent from the industrial and mass productivity perspectives.

Figure 1:
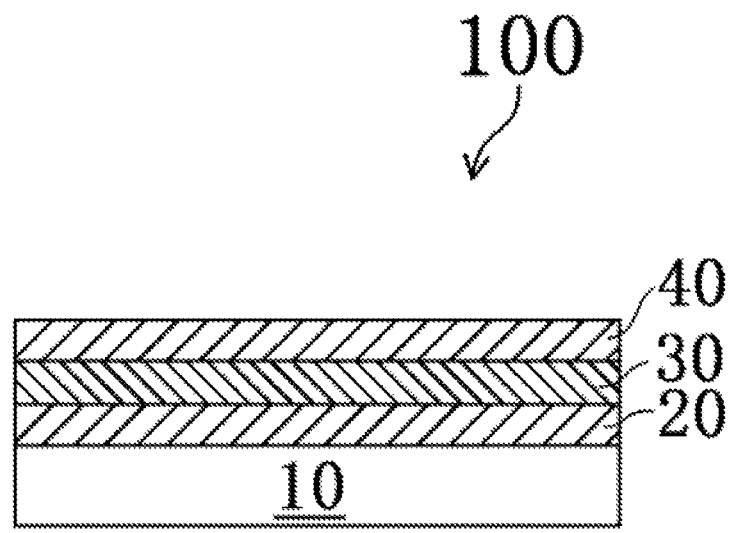
FIG. 1 is a view of an entire configuration of a thin film capacitor exemplifying a solid-state electronic device according to a first embodiment of the present invention.

DESCRIPTION OF REFERENCE SIGNS 10 substrate
20,220,320.420 lower electrode layer
220a,320a,420a lower electrode layer precursor layer
30,230,330.430 oxide layer
30a,230a,330a.430a oxide layer precursor layer
40,240,340.440 upper electrode layer
240a,340a,440a upper electrode layer precursor layer
100,200,300,400 thin film capacitor exemplifying solid-state electronic device
M1 lower electrode layer mold
M2 insulating layer mold
M3 upper electrode layer mold
M4 stacked body mold

EMBODIMENTS OF THE INVENTION

A solid-state electronic device according to each of the embodiments of the present invention is described in detail with reference to the accompanying drawings. In this disclosure, common parts are denoted by common reference signs in all the drawings unless otherwise specified. Furthermore, components according to these embodiments are not necessarily illustrated in accordance with relative scaling in the drawings. Moreover, some of the reference signs may not be indicated for the purpose of easier recognition of the respective drawings.

First Embodiment

1. Entire Configuration of Thin Film Capacitor According to the Present Embodiment FIG. 1 is a view of an entire configuration of a thin film capacitor 100 exemplifying a solid-state electronic device according to the present embodiment. As shown in FIG. 1, the thin film capacitor 100 includes a substrate 10, a lower electrode layer 20, an oxide layer 30 serving as an insulating layer made of a dielectric substance, and an upper electrode layer 40. The lower electrode layer 20, the oxide layer 30, and the upper electrode layer 40 are stacked on the substrate 10 in this order.

The substrate 10 can be made of any one of various insulating base materials including highly heat resistant glass, an $SiO_2/Si$ substrate, an alumina ($Al_2O_3$) substrate, an STO (SrTiO) substrate, an insulating substrate obtained by forming an STO (SrTiO) layer on a surface of an Si substrate with an $SiO_2$ layer and a Ti layer being interposed therebetween, and a semiconductor substrate (e.g. an Si substrate, an SiC substrate, or a Ge substrate).

The lower electrode layer 20 and the upper electrode layer 40 are each made of any one of metallic materials including high melting metal such as platinum, gold, silver, copper, aluminum, molybdenum, palladium, ruthenium, iridium, or tungsten, alloy thereof, and the like.

In the present embodiment, the insulating layer made of a dielectric substance is formed by heating, in an atmosphere containing oxygen, a precursor layer obtained from a precursor solution as a start material including both a precursor containing bismuth (Bi) and a precursor containing niobium (Nb) as solutes (hereinafter, a production method including this step is also called the solution technique). There is thus formed the oxide layer 30 consisting of bismuth (Bi) and niobium (Nb) (possibly containing inevitable impurities). Furthermore, as to be described later, the present embodiment is characterized in that a heating temperature (a main baking temperature) for forming the oxide layer is set in the range from 520° C. to 650° C. The oxide layer consisting of bismuth (Bi) and niobium (Nb) is also called a BNO layer.

The present embodiment is not limited to this structure. Moreover, patterning of an extraction electrode layer from each electrode layer is not illustrated in order to simplify the drawings.

2. Method of Producing Thin Film Capacitor 100

Figure 2:
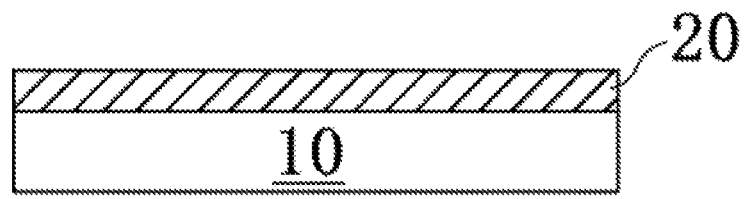
FIG. 2 is a sectional schematic view of a process in a method of producing the thin film capacitor according to the first embodiment of the present invention.

Described next is a method of producing the thin film capacitor 100. Temperatures indicated in this application are preset temperatures of a heater. FIGS. 2 to 5 are sectional schematic views each showing a process in the method of producing the thin film capacitor 100. As shown in FIG. 2, the lower electrode layer 20 is initially formed on the substrate 10. The oxide layer 30 is then formed on the lower electrode layer 20, and the upper electrode layer 40 is subsequently formed on the oxide layer 30.

(1) Formation of Lower Electrode Layer

FIG. 2 shows the step of forming the lower electrode layer 20. The present embodiment exemplifies a case where the lower electrode layer 20 in the thin film capacitor 100 is made of platinum (Pt). The lower electrode layer 20 made of platinum (Pt) is formed on the substrate 10 in accordance with the known sputtering technique.

(2) Formation of Oxide Layer Serving as Insulating Layer

Figure 3:
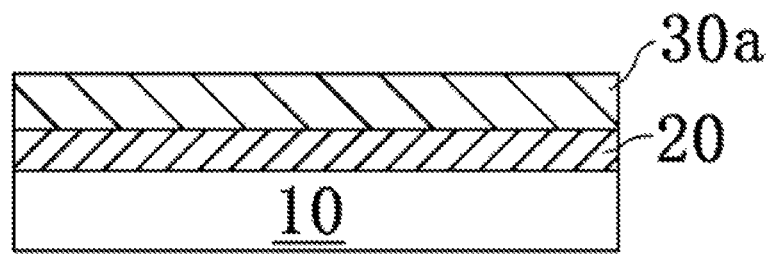
FIG. 3 is a sectional schematic view of a process in the method of producing the thin film capacitor according to the first embodiment of the present invention.
Figure 4:
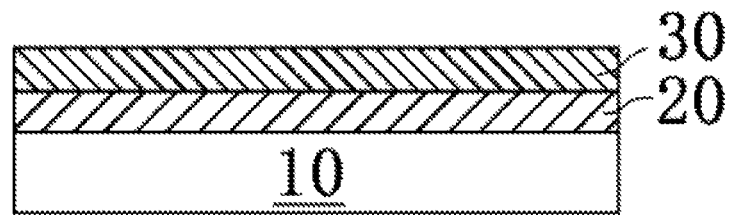
FIG. 4 is a sectional schematic view of a process in the method of producing the thin film capacitor according to the first embodiment of the present invention.

The oxide layer 30 is then formed on the lower electrode layer 20. The oxide layer 30 is formed through (a) the step of forming and preliminarily baking the precursor layer and then (b) the main baking step. FIGS. 3 and 4 each show the step of forming the oxide layer 30. The present embodiment exemplifies a case where the oxide layer 30 is formed using oxide consisting of bismuth (Bi) and niobium (Nb) in the steps of producing the thin film capacitor 100.

(a) Formation and Preliminary Baking of Precursor Layer

As shown in FIG. 3, formed on the lower electrode layer 20 in accordance with the known spin coating technique is a precursor layer 30a obtained from a precursor solution as a start material including both a precursor containing bismuth (Bi) and a precursor containing niobium (Nb) as solutes (called a precursor solution; hereinafter, this applied to a solution of a precursor). Examples of the precursor containing bismuth (Bi) for the oxide layer 30 possibly include bismuth octylate, bismuth chloride, bismuth nitrate, and any bismuth alkoxide (e.g. bismuth isopropoxide, bismuth butoxide, bismuth ethoxide, or bismuth methoxyethoxide). Examples of the precursor containing niobium (Nb) for the oxide layer 30 in the present embodiment possibly include niobium octylate, niobium chloride, niobium nitrate, and any niobium alkoxide (e.g. niobium isopropoxide, niobium butoxide, niobium ethoxide, or niobium methoxyethoxide). The precursor solution preferably includes a solvent of one alcohol selected from the group consisting of ethanol, propanol, butanol, 2-methoxyethanol, 2-ethoxyethanol, and 2-butoxyethanol, or a solvent of one carboxylic acid selected from the group consisting of acetic acid, propionic acid, and octylic acid.

The preliminary baking is then performed in the oxygen atmosphere or in the atmosphere (collectively called an "atmosphere containing oxygen") for a predetermined time period at a temperature in the range from 80° C. to 250° C. The preliminary baking sufficiently evaporates the solvent in the precursor layer 30a and causes a preferred gel state for exerting properties that enable future plastic deformation (possibly a state where organic chains remain before pyrolysis). The preliminary baking is performed preferably at a temperature from 80° C. to 250° C. in order to reliably cause the above phenomena. The formation of the precursor layer 30a in accordance with the spin coating technique and the preliminary baking are repeated for a plurality of times, so that the oxide layer 30 has desired thickness.

(b) Main Baking

The precursor layer 30a is thereafter heated for a predetermined time period in the oxygen atmosphere (e.g. 100% by volume, although being not limited thereto) at a temperature in the range from 520° C. to 650° C. so as to be mainly baked. As shown in FIG. 4, there is thus formed the oxide layer 30 consisting of bismuth (Bi) and niobium (Nb) (possibly containing inevitable impurities; this applies hereinafter) on the electrode layer. The main baking in accordance with the solution technique is performed in order to form the oxide layer at a heating temperature from 520° C. to 650° C., although this upper limit is not fixed to such a degree. The heating temperature exceeding 650° C. stimulates crystallization of the oxide layer and tends to cause remarkable increase in amount of leakage current. The heating temperature is thus preferably set not to exceed 650° C. The heating temperature less than 520° C. causes carbon in the solvent and the solute in the precursor solution to remain and causes remarkable increase in amount of leakage current. The heating temperature is thus preferably set in the range from 520° C. to 650° C.

The oxide layer 30 is preferably at least 30 nm in thickness. If the oxide layer 30 is less than 30 nm in thickness, the leakage current and dielectric loss increase due to decrease in thickness. It is impractical and thus not preferred for a solid-state electronic device to include such an oxide layer.

Table 1 indicates measurement results on the relationship among the atomic composition ratio between bismuth (Bi) and niobium (Nb) in the oxide layer 30, relative permittivity at 1 KHz, and a leakage current value upon applying 0.5 MV/cm.

TABLE 1

| Nb/Bi ratio | Relative permittivity (1 KHz) | Leakage current (A/cm$^2$) (0.5 MV/cm) |
|---|---|---|
| 3.3 | 62 | $1.4 \times 10^{-6}$ |
| 2.0 | 134 | $2.5 \times 10^{-4}$ |
| 1.1 | 201 | $5.8 \times 10^{-6}$ |
| 0.8 | 137 | $4.2 \times 10^{-6}$ |

The atomic composition ratio between bismuth (Bi) and niobium (Nb) was obtained by performing elementary analysis on bismuth (Bi) and niobium (Nb) in accordance with the Rutherford backscattering spectrometry (RBS). The methods of measuring the relative permittivity and the leakage current value are to be detailed later. Table 1 indicates the results of the relative permittivity upon applying the AC voltage of 1 KHz and the leakage current value upon applying the voltage of 0.5 MV/cm. According to Table 1, when the atomic composition ratio between bismuth (Bi) and niobium (Nb) in the oxide layer 30 is in the range from 0.8 to 3.3 relative to bismuth (Bi) assumed to be one, the relative permittivity and the leakage current value had appropriate values for a device.

(3) Formation of Upper Electrode Layer

Figure 5:
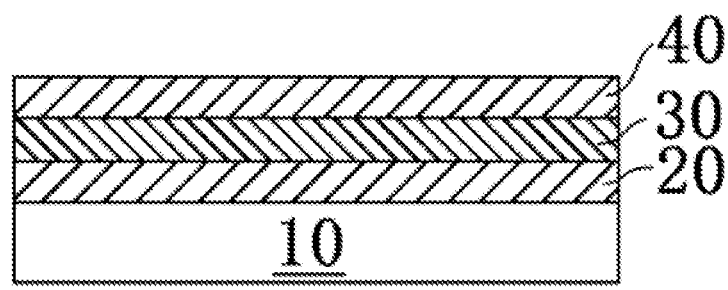
FIG. 5 is a sectional schematic view of a process in the method of producing the thin film capacitor according to the first embodiment of the present invention.

The upper electrode layer 40 is subsequently formed on the oxide layer 30. FIG. 5 shows the step of forming the upper electrode layer 40. The present embodiment exemplifies a case where the upper electrode layer 40 in the thin film capacitor 100 is made of platinum (Pt). Similarly to the lower electrode layer 20, the upper electrode layer 40 made of platinum (Pt) is formed on the oxide layer 30 in accordance with the known sputtering technique.

The solid-state electronic device according to the present embodiment includes the oxide layer that is formed by heating, in an atmosphere containing oxygen, the precursor layer obtained from the precursor solution as a start material including both the precursor containing bismuth (Bi) and the precursor containing niobium (Nb) as solutes, the oxide layer consisting of bismuth (Bi) and niobium (Nb). Furthermore, the oxide layer is formed by heating at a heating temperature from 520° C. to 650° C. These features lead to preferred electrical properties. Furthermore, the precursor solution for the oxide layer has only to be heated in an atmosphere containing oxygen without adopting the vacuum process. Accordingly, increase in area is facilitated and improvement from the industrial and mass productivity perspectives can be significantly achieved in comparison to the conventional sputtering technique.

Second Embodiment

Figure 10:
FIG. 10 is a view of an entire configuration of the thin film capacitor exemplifying a solid-state electronic device according to the second embodiment of the present invention.
Figure 10:
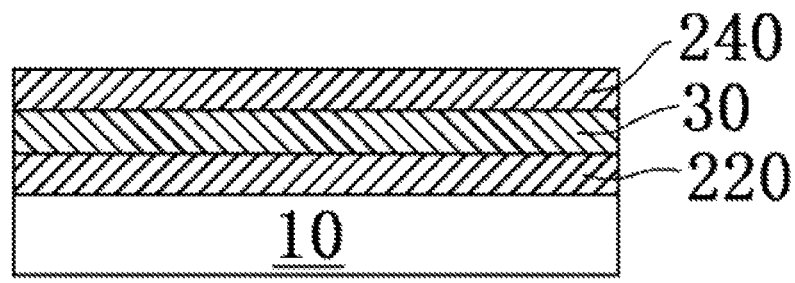

1. Entire Configuration of Thin Film Capacitor According to the Present Embodiment A thin film capacitor exemplifying a solid-state electronic device according to the present embodiment includes a lower electrode layer and an upper electrode layer each of which is made of conductive oxide (possibly containing inevitable impurities) such as metal oxide. FIG. 10 shows an entire configuration of a thin film capacitor 200 exemplifying the solid-state electronic device according to the present embodiment. The present embodiment is similar to the first embodiment except that the lower electrode layer and the upper electrode layer are each made of conductive oxide such as metal oxide. In the configurations according to the present embodiment, those corresponding to the configurations depicted in FIG. 1 are denoted by the same reference signs and are not described repeatedly, and those different from the configurations depicted in FIG. 1 are to be described below. As shown in FIG. 10, the thin film capacitor 200 includes the substrate 10, a lower electrode layer 220, the oxide layer 30 serving as an insulating layer made of a dielectric substance, and an upper electrode layer 240. The lower electrode layer 220, the oxide layer 30, and the upper electrode layer 240 are stacked on the substrate 10 in this order.

Examples of the lower electrode layer 220 and the upper electrode layer 240 can include an oxide layer consisting of lanthanum (La) and nickel (Ni), an oxide layer consisting of antimony (Sb) and tin (Sn), and an oxide layer consisting of indium (In) and tin (Sn) (possibly containing inevitable impurities; this applies hereinafter).

2. Steps of Producing Thin Film Capacitor 200

Figure 6:
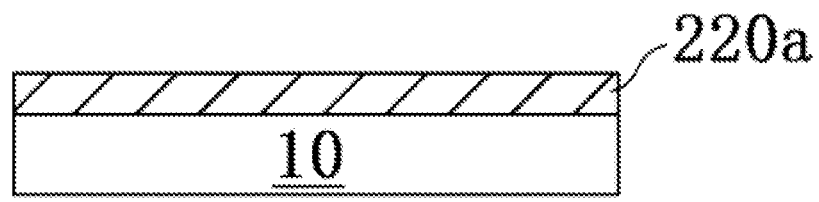
FIG. 6 is a sectional schematic view of a process in a method of producing a thin film capacitor according to a second embodiment of the present invention.
Figure 7:
FIG. 7 is a sectional schematic view of a process in the method of producing the thin film capacitor according to the second embodiment of the present invention.

Described next is a method of producing the thin film capacitor 200. FIGS. 6 to 9 are sectional schematic views each showing a process in the method of producing the thin film capacitor 200. As shown in FIGS. 6 and 7, the lower electrode layer 220 is initially formed on the substrate 10. The oxide layer 30 is then formed on the lower electrode layer 220, and the upper electrode layer 240 is subsequently formed. In the steps of producing the thin film capacitor 200, those similar to the steps according to the first embodiment are not described repeatedly.

(1) Formation of Lower Electrode Layer

FIGS. 6 and 7 each show the step of forming the lower electrode layer 220. The present embodiment exemplifies a case where the lower electrode layer 220 in the thin film capacitor 200 is a conducting oxide layer consisting of lanthanum (La) and nickel (Ni). The lower electrode layer 220 is formed through (a) the step of forming and preliminarily baking the precursor layer and then (b) the main baking step.

(a) Formation and Preliminary Baking of Precursor Layer

As shown in FIG. 6, formed on the substrate 10 in accordance with the known spin coating technique is a lower electrode layer precursor layer 220a obtained from a precursor solution as a start material including both a precursor containing lanthanum (La) and a precursor containing nickel (Ni) as solutes (called a lower electrode layer precursor solution; hereinafter, this applied to a solution of a lower electrode layer precursor). Examples of the precursor containing lanthanum (La) for the lower electrode layer 220 include lanthanum acetate. The examples also possibly include lanthanum nitrate, lanthanum chloride, and any lanthanum alkoxide (e.g. lanthanum isopropoxide, lanthanum butoxide, lanthanum ethoxide, or lanthanum methoxyethoxide). Examples of the precursor containing nickel (Ni) for the lower electrode layer precursor layer 220a include nickel acetate. The examples also possibly include nickel nitrate, nickel chloride, and any nickel alkoxide (e.g. nickel indium isopropoxide, nickel butoxide, nickel ethoxide, or nickel methoxyethoxide).

When the lower electrode layer is a conducting oxide layer consisting of antimony (Sb) and tin (Sn), examples of a lower electrode layer precursor containing antimony (Sb) possibly include antimony acetate, antimony nitrate, antimony chloride, and any antimony alkoxide (e.g. antimony isopropoxide, antimony butoxide, antimony ethoxide, or antimony methoxyethoxide). Examples of a precursor containing tin (Sn) possibly include tin acetate, tin nitrate, tin chloride, and any tin alkoxide (e.g. antimony isopropoxide, antimony butoxide, antimony ethoxide, or antimony methoxyethoxide). When the lower electrode layer is made of conducting oxide consisting of indium (In) and tin (Sn), examples of a precursor containing indium (In) possibly include indium acetate, indium nitrate, indium chloride, and any indium alkoxide (e.g. indium isopropoxide, indium butoxide, indium ethoxide, or indium methoxyethoxide). Examples of a lower electrode layer precursor containing tin (Sn) are similar to those listed above.

The preliminary baking is then performed in an atmosphere containing oxygen for a predetermined time period at a temperature in the range from 80° C. to 250° C., for the same reason on the oxide layer according to the first embodiment. The formation of the lower electrode layer precursor layer 220a in accordance with the spin coating technique and the preliminary baking are repeated for a plurality of times, so that the lower electrode layer 220 has desired thickness.

(b) Main Baking

The lower electrode layer precursor layer 220a is then heated to 550° C. for about 20 minutes in the oxygen atmosphere so as to be mainly baked. As shown in FIG. 7, there is thus formed, on the substrate 10, the lower electrode layer 220 consisting of lanthanum (La) and nickel (Ni) (possibly containing inevitable impurities; this applies hereinafter). The main baking in accordance with the solution technique is performed in order to form the conducting oxide layer preferably at a heating temperature from 520° C. to 650° C., for the same reason on the oxide layer according to the first embodiment. The conducting oxide layer consisting of lanthanum (La) and nickel (Ni) is also called an LNO layer.

(2) Formation of Oxide Layer Serving as Insulating Layer

Figure 8:
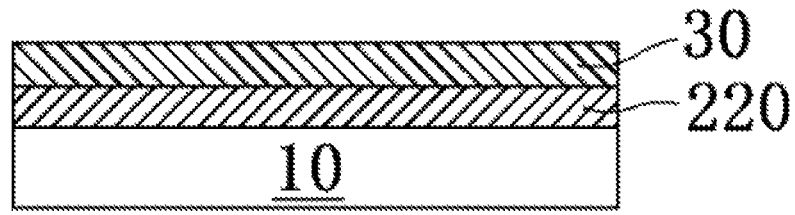
FIG. 8 is a sectional schematic view of a process in the method of producing the thin film capacitor according to the second embodiment of the present invention.

The oxide layer 30 is subsequently formed on the lower electrode layer 220. Similarly to the first embodiment, the oxide layer 30 according to the present embodiment is formed through (a) the step of forming and preliminarily baking the precursor layer and then (b) the main baking step. FIG. 8 shows the state where the oxide layer 30 is formed on the lower electrode layer 220. Similarly to the first embodiment, the oxide layer 30 is preferably at least 30 nm in thickness.

(3) Formation of Upper Electrode Layer

Figure 9:
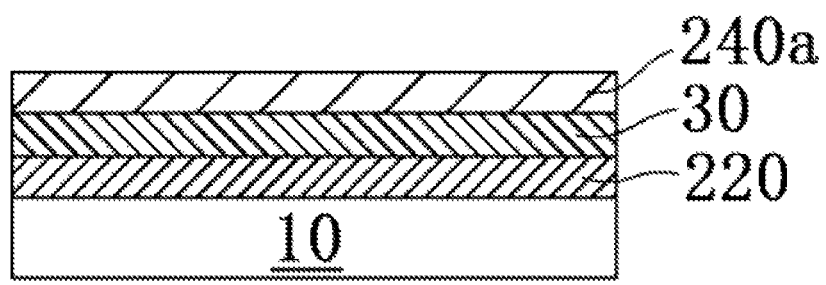
FIG. 9 is a sectional schematic view of a process in the method of producing the thin film capacitor according to the second embodiment of the present invention.

As shown in FIGS. 9 and 10, the upper electrode layer 240 is subsequently formed on the oxide layer 30. The present embodiment exemplifies a case where the upper electrode layer 240 in the thin film capacitor 200 is a conducting oxide layer consisting of lanthanum (La) and nickel (Ni), similarly to the lower electrode layer 220. Similarly to the lower electrode layer 220, the upper electrode layer 240 is formed through (a) the step of forming and preliminarily baking the precursor layer and then (b) the main baking step. FIG. 9 shows a lower electrode layer precursor layer 240a formed on the oxide layer 30. FIG. 10 shows the upper electrode layer 240 formed on the oxide layer 30.

The solid-state electronic device according to the present embodiment also includes the oxide layer that is formed by heating, in an atmosphere containing oxygen, the precursor layer obtained from the precursor solution as a start material including both the precursor containing bismuth (Bi) and the precursor containing niobium (Nb) as solutes, the oxide layer consisting of bismuth (Bi) and niobium (Nb). Furthermore, the oxide layer is formed by heating at a heating temperature from 520° C. to 650° C. These features lead to preferred electrical properties. Furthermore, the precursor solution for the oxide layer has only to be heated in an atmosphere containing oxygen without adopting the vacuum process. Improvement can be thus achieved from the industrial and mass productivity perspectives. Furthermore, the lower electrode layer, the oxide layer serving as an insulating layer, and the upper electrode layer are each made of metal oxide and all the steps can be executed in an atmosphere containing oxygen without adopting the vacuum process. Accordingly, increase in area is facilitated and improvement from the industrial and mass productivity perspectives can be significantly achieved in comparison to the conventional sputtering technique.

Third Embodiment

Figure 11:
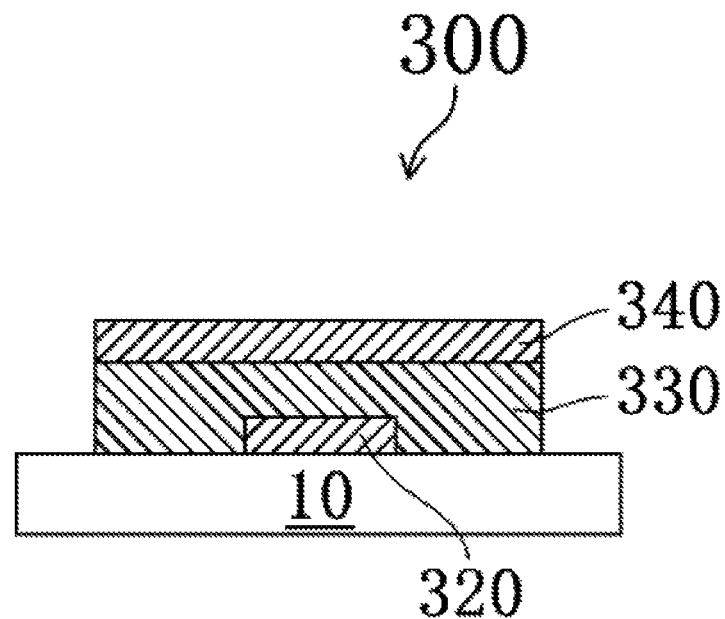
FIG. 11 is a view of an entire configuration of a thin film capacitor exemplifying a solid-state electronic device according to a third embodiment of the present invention.

1. Entire Configuration of Thin Film Capacitor According to the Present Embodiment Imprinting is performed in the step of forming every one of the layers in a thin film capacitor exemplifying a solid-state electronic device according to the present embodiment. FIG. 11 shows an entire configuration of a thin film capacitor 300 exemplifying the solid-state electronic device according to the present embodiment. The present embodiment is similar to the second embodiment except that the lower electrode layer and the oxide layer are imprinted. In the configurations according to the present embodiment, those corresponding to the configurations depicted in FIG. 10 are denoted by the same reference signs and are not described repeatedly, and those different from the configurations depicted in FIG. 10 are to be described below. As shown in FIG. 11, the thin film capacitor 300 includes the substrate 10, a lower electrode layer 320, an oxide layer 330 serving as an insulating layer made of a dielectric substance, and an upper electrode layer 340. The lower electrode layer 220, the oxide layer 330, and the upper electrode layer 340 are stacked on the substrate 10 in this order.

In this application, "imprinting" is also called "nanoimprinting".

2. Steps of Producing Thin Film Capacitor 300

Described next is a method of producing the thin film capacitor 300. FIGS. 12 to 21 are sectional schematic views each showing a process in the method of producing the thin film capacitor 300. Initially formed on the substrate 10 of the thin film capacitor 300 is the imprinted lower electrode layer 320. The imprinted oxide layer 330 is subsequently formed on the lower electrode layer 320. The upper electrode layer 340 is then formed on the oxide layer 330. In the steps of producing the thin film capacitor 300, those similar to the steps according to the second embodiment are not described repeatedly.

(1) Formation of Lower Electrode Layer

The present embodiment exemplifies a case where the lower electrode layer 320 in the thin film capacitor 300 is a conducting oxide layer consisting of lanthanum (La) and nickel (Ni). The lower electrode layer 320 is formed through (a) the step of forming and preliminarily baking the precursor layer, (b) the imprinting step, and (c) the main baking step, in this order. Initially formed on the substrate 10 in accordance with the known spin coating technique is a lower electrode layer precursor layer 320a obtained from a lower electrode layer precursor solution as a start material including both a precursor containing lanthanum (La) and a precursor containing nickel (Ni) as solutes.

The lower electrode layer precursor layer 320a is then heated in an atmosphere containing oxygen for a predetermined time period at a temperature in the range from 80° C. to 250° C. so as to be preliminarily baked. The formation of the lower electrode layer precursor layer 320a in accordance with the spin coating technique and the preliminary baking are repeated for a plurality of times, so that the lower electrode layer 320 has desired thickness.

(b) Imprinting

Figure 12:
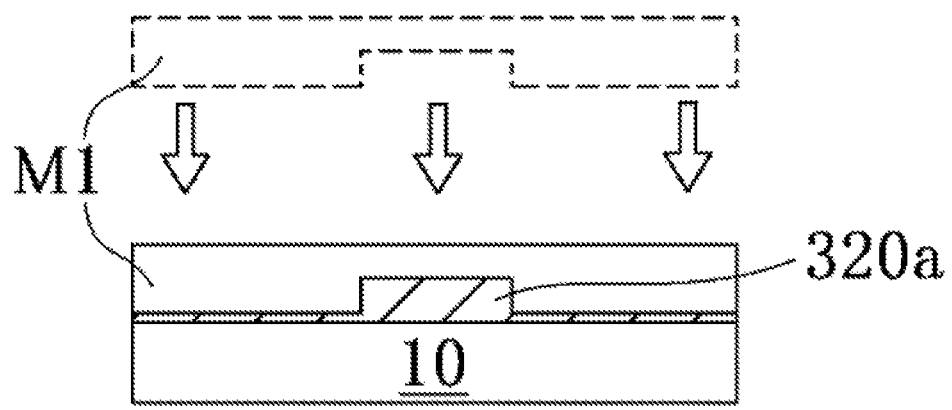
FIG. 12 is a sectional schematic view of a process in a method of producing the thin film capacitor according to the third embodiment of the present invention.

As shown in FIG. 12, the imprinting is subsequently performed using a lower electrode layer mold M1 with a pressure from 1 MPa to 20 MPa while the lower electrode layer precursor layer 320a is heated at a temperature in the range from 80° C. to 300° C. so as to pattern the lower electrode layer precursor layer 320a. Examples of a heating method for the imprinting include a method of causing an atmosphere at a predetermined temperature using a chamber, an oven, or the like, a method of heating a base provided thereon with the substrate from below using a heater, and a method of imprinting using a mold preliminarily heated to a temperature from 80° C. to 300° C. In view of processability, the imprinting is more preferably performed in accordance with the method of heating a base from below using a heater, as well as using a mold preliminarily heated to a temperature from 80° C. to 300° C.

The mold heating temperature is set in the range from 80° C. to 300° C. for the following reasons. If the heating temperature for the imprinting is less than 80° C., the temperature of the lower electrode layer precursor layer 320a is decreased so that plastic deformability of the lower electrode layer precursor layer 320a is deteriorated. This leads to lower moldability during formation of an imprinted structure, or lower reliability or stability after the formation. In contrast, if the heating temperature for the imprinting exceeds 300° C., decomposition of organic chains (oxidative pyrolysis) exerting plastic deformability proceeds and thus the plastic deformability is deteriorated. In view of the above, according to a more preferred aspect, the lower electrode layer precursor layer 320a is heated at a temperature in the range from 100° C. to 250° C. for the imprinting.

The imprinting can be performed with a pressure in the range from 1 MPa to 20 MPa so that the lower electrode layer precursor layer 320a is deformed so as to follow the shape of the surface of the mold. It is thus possible to highly accurately form a desired imprinted structure. The pressure to be applied for the imprinting is set in such a low range from 1 MPa to 20 MPa. In this case, the mold is unlikely to be damaged during the imprinting and increase in area can be also achieved advantageously.

Figure 13:
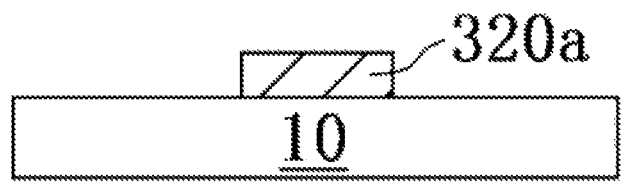
FIG. 13 is a sectional schematic view of a process in the method of producing the thin film capacitor according to the third embodiment of the present invention.

The lower electrode layer precursor layer 320a is then entirely etched. As shown in FIG. 13, the lower electrode layer precursor layer 320a is thus entirely removed in the regions other than a region corresponding to the lower electrode layer (the step of entirely etching the lower electrode layer precursor layer 320a).

In this imprinting, preferably, a mold separation process is preliminarily performed on the surface of each of the precursor layers to be in contact with an imprinting surface and/or on the imprinting surface of the mold, and each of the precursor layers is then imprinted. Such a process is performed. Frictional force between each of the precursor layers and the mold can be thus decreased, so that the precursor layer can be imprinted with higher accuracy. Examples of a mold separation agent applicable in the mold separation process include surface active agents (e.g. a fluorochemical surface active agent, a silicon surface active agent, and a non-ionic surface active agent), and diamond-like carbon containing fluorine.

(c) Main Baking

Figure 14:
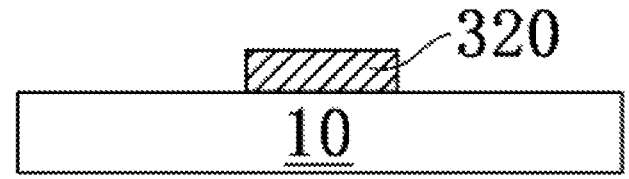
FIG. 14 is a sectional schematic view of a process in the method of producing the thin film capacitor according to the third embodiment of the present invention.

The lower electrode layer precursor layer 320a is then mainly baked. As shown in FIG. 14, there is thus formed, on the substrate 10, the lower electrode layer 320 consisting of lanthanum (La) and nickel (Ni) (possibly containing inevitable impurities; this applies hereinafter).

(2) Formation of Oxide Layer Serving as Insulating Layer

The oxide layer 330 serving as an insulating layer is subsequently formed on the lower electrode layer 320. The oxide layer 330 is formed through (a) the step of forming and preliminarily baking the precursor layer, (b) the imprinting step, and (c) the main baking step, in this order. FIGS. 15 to 18 each show the step of forming the oxide layer 330.

(a) Formation and Preliminary Baking of Precursor Layer

Figure 15:
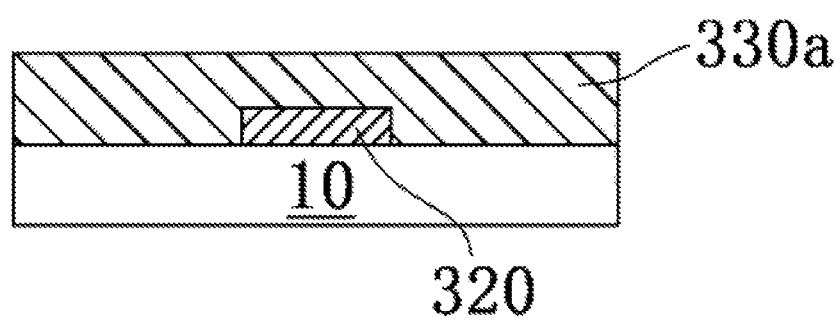
FIG. 15 is a sectional schematic view of a process in the method of producing the thin film capacitor according to the third embodiment of the present invention.

As shown in FIG. 15, similarly to the second embodiment, formed on the substrate 10 and the patterned lower electrode layer 320 is a precursor layer 330a obtained from a precursor solution as a start material including both a precursor containing bismuth (Bi) and a precursor containing niobium (Nb) as solutes. The precursor layer 330a is then preliminarily baked in an atmosphere containing oxygen in the state where the precursor layer 330a is heated to a temperature from 80° C. to 250° C.

(b) Imprinting

Figure 16:
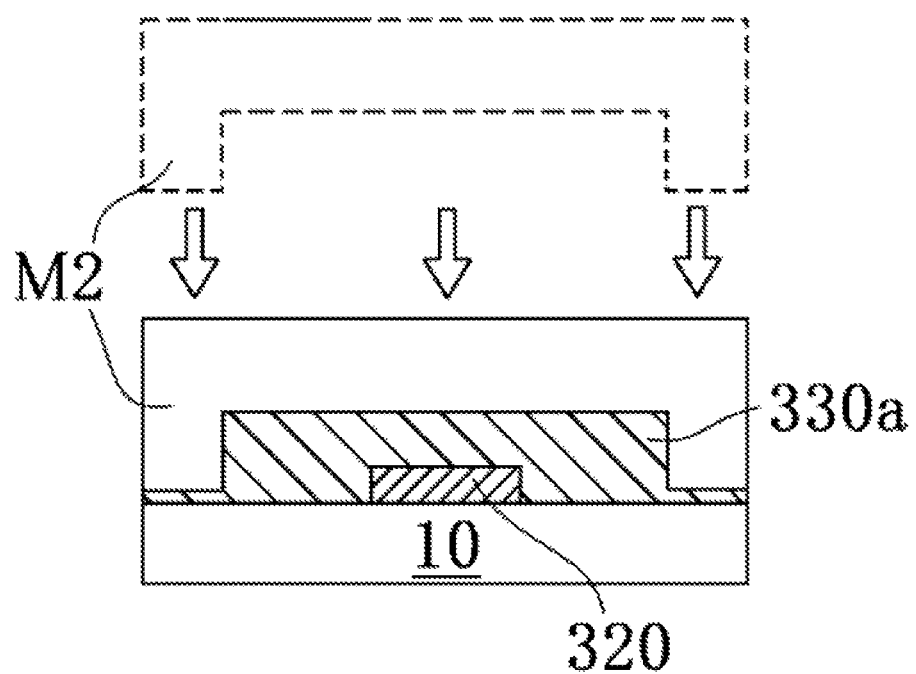
FIG. 16 is a sectional schematic view of a process in the method of producing the thin film capacitor according to the third embodiment of the present invention.

As shown in FIG. 16, the precursor layer 330a only preliminarily baked is imprinted in the present embodiment. Specifically, the imprinting is performed using an insulating layer mold M2 with a pressure from 1 MPa to 20 MPa in the state where the precursor layer 330a is heated to a temperature from 80° C. to 300° C. so as to pattern the oxide layer.

Figure 17:
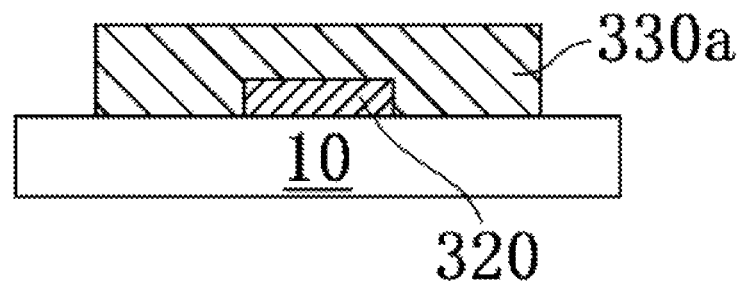
FIG. 17 is a sectional schematic view of a process in the method of producing the thin film capacitor according to the third embodiment of the present invention.

The precursor layer 330a is then entirely etched. As shown in FIG. 17, the precursor layer 330a is thus entirely removed in the regions other than a region corresponding to the oxide layer 330 (the step of entirely etching the precursor layer 330a). The step of etching the precursor layer 330a in the present embodiment is executed in accordance with the wet etching technique without adopting the vacuum process. The etching can be possibly performed using plasma, in accordance with the so-called dry etching technique.

(c) Main Baking

Figure 18:
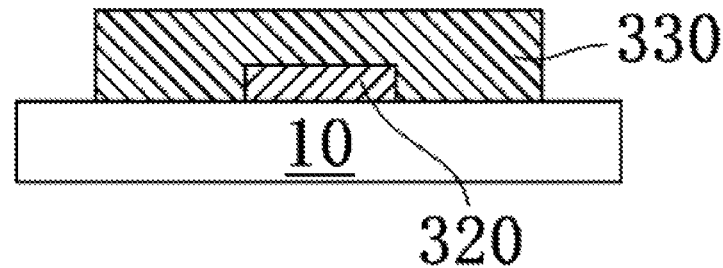
FIG. 18 is a sectional schematic view of a process in the method of producing the thin film capacitor according to the third embodiment of the present invention.

Similarly to the second embodiment, the precursor layer 330a is then mainly baked. As shown in FIG. 18, the oxide layer 330 serving as an insulating layer (possibly containing inevitable impurities; this applies hereinafter) is thus formed on the lower electrode layer 320. The precursor layer 330a is heated in the oxygen atmosphere for a predetermined time period at a temperature in the range from 520° C. to 650° C. so as to be mainly baked.

The step of entirely etching the precursor layer 330a can be executed after the main baking. As described above, according to a more preferred aspect, the step of entirely etching the precursor layer is executed between the imprinting step and the main baking step. This is because the unnecessary region can be removed more easily than the case of etching each precursor layer after the main baking.

(3) Formation of Upper Electrode Layer

Similarly to the lower electrode layer 320, subsequently formed on the oxide layer 330 in accordance with the known spin coating technique is an upper electrode layer precursor layer 340a obtained from a precursor solution as a start material including both a precursor containing lanthanum (La) and a precursor containing nickel (Ni) as solutes. The upper electrode layer precursor layer 340a is then heated in an atmosphere containing oxygen at a temperature in the range from 80° C. to 250° C. so as to be preliminarily baked.

Figure 19:
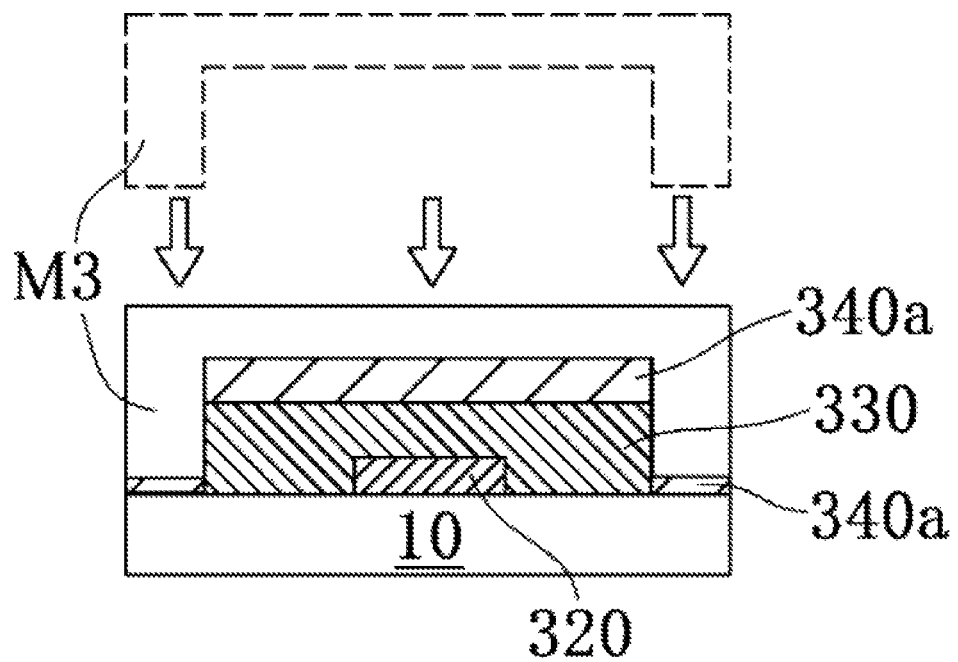
FIG. 19 is a sectional schematic view of a process in the method of producing the thin film capacitor according to the third embodiment of the present invention.
Figure 20:
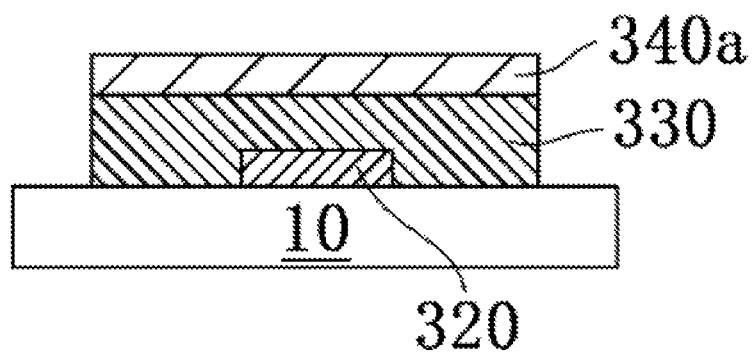
FIG. 20 is a sectional schematic view of a process in the method of producing the thin film capacitor according to the third embodiment of the present invention.

As shown in FIG. 19, the upper electrode layer precursor layer 340a having been preliminarily baked is subsequently imprinted using an upper electrode layer mold M3 with a pressure from 1 MPa to 20 MPa in the state where the upper electrode layer precursor layer 340a is heated to a temperature from 80° C. to 300° C. so as to pattern the upper electrode layer precursor layer 340a. As shown in FIG. 20, the upper electrode layer precursor layer 340a is then entirely etched so that the upper electrode layer precursor layer 340a is entirely removed in the regions other than a region corresponding to the upper electrode layer 340.

Figure 21:
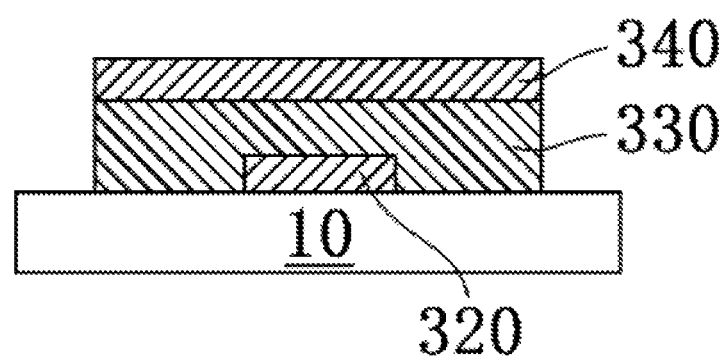
FIG. 21 is a sectional schematic view of a process in the method of producing the thin film capacitor according to the third embodiment of the present invention.

As shown in FIG. 21, the upper electrode layer precursor layer 340a is then heated in the oxygen atmosphere for a predetermined time period to a temperature from 530° C. to 600° C. so as to be mainly baked. The upper electrode layer 340 consisting of lanthanum (La) and nickel (Ni) (possibly containing inevitable impurities; this applies hereinafter) is thus formed on the oxide layer 330.

The solid-state electronic device according to the present embodiment also includes the oxide layer that is formed by heating, in an atmosphere containing oxygen, the precursor layer obtained from the precursor solution as a start material including both the precursor containing bismuth (Bi) and the precursor containing niobium (Nb) as solutes, the oxide layer consisting of bismuth (Bi) and niobium (Nb). Furthermore, the oxide layer is formed by heating at a heating temperature from 520° C. to 650° C. These features lead to preferred electrical properties. Furthermore, the precursor solution for the oxide layer has only to be heated in an atmosphere containing oxygen without adopting the vacuum process. Accordingly, increase in area is facilitated and improvement from the industrial and mass productivity perspectives can be significantly achieved in comparison to the conventional sputtering technique.

In the present embodiment, the lower electrode layer 320, the oxide layer 330 serving as an insulating layer, and the upper electrode layer 340 are stacked on the substrate 10 in this order. The imprinted structure is formed by performing the imprinting. There is thus no need to include a process requiring relatively long time and/or expensive equipment, such as the vacuum process, a process in accordance with the photolithography technique, or the ultraviolet irradiation process. Both the electrode layers and the oxide layer can be thus patterned easily. The thin film capacitor 300 according to the present embodiment is excellent from the industrial and mass productivity perspectives.

Fourth Embodiment

Figure 25:
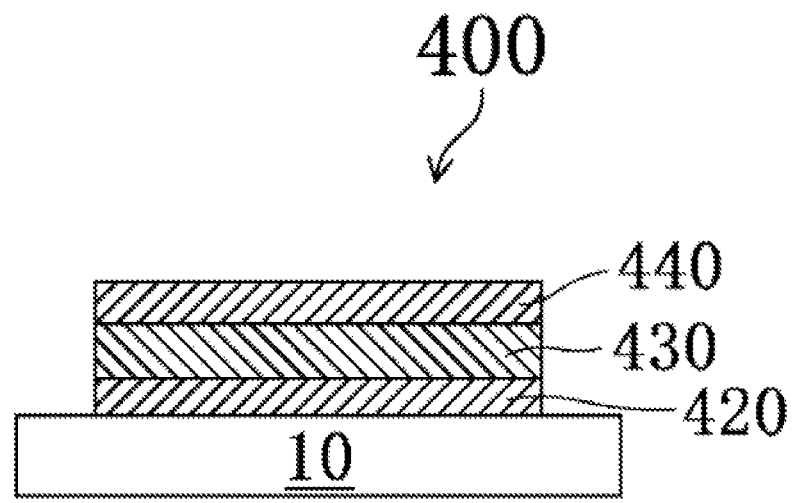
FIG. 25 is a view of an entire configuration of the thin film capacitor exemplifying a solid-state electronic device according to the fourth embodiment of the present invention.

1. Entire Configuration of Thin Film Capacitor According to the Present Embodiment Imprinting is performed in the step of forming every one of the layers in a thin film capacitor exemplifying a solid-state electronic device also according to the present embodiment. FIG. 25 shows an entire configuration of a thin film capacitor 400 exemplifying the solid-state electronic device according to the present embodiment. Each of a lower electrode layer, an oxide layer, and an upper electrode layer according to the present embodiment is preliminarily baked after a corresponding precursor layer is stacked. Each of the precursor layers having been preliminarily baked is imprinted and then mainly baked. In the configurations according to the present embodiment, those corresponding to the configurations depicted in FIG. 11 are denoted by the same reference signs and are not described repeatedly, and those different from the configurations depicted in FIG. 11 are to be described below. As shown in FIG. 25, the thin film capacitor 400 includes the substrate 10, a lower electrode layer 420, an oxide layer 430 serving as an insulating layer made of a dielectric substance, and an upper electrode layer 440. The lower electrode layer 420, the oxide layer 430, and the upper electrode layer 440 are stacked on the substrate 10 in this order.

2. Steps of Producing Thin Film Capacitor 400

Figure 22:
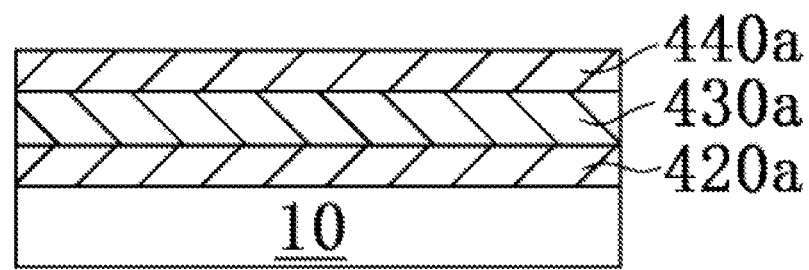
FIG. 22 is a sectional schematic view of a process in a method of producing a thin film capacitor according to a fourth embodiment of the present invention.
Figure 23:
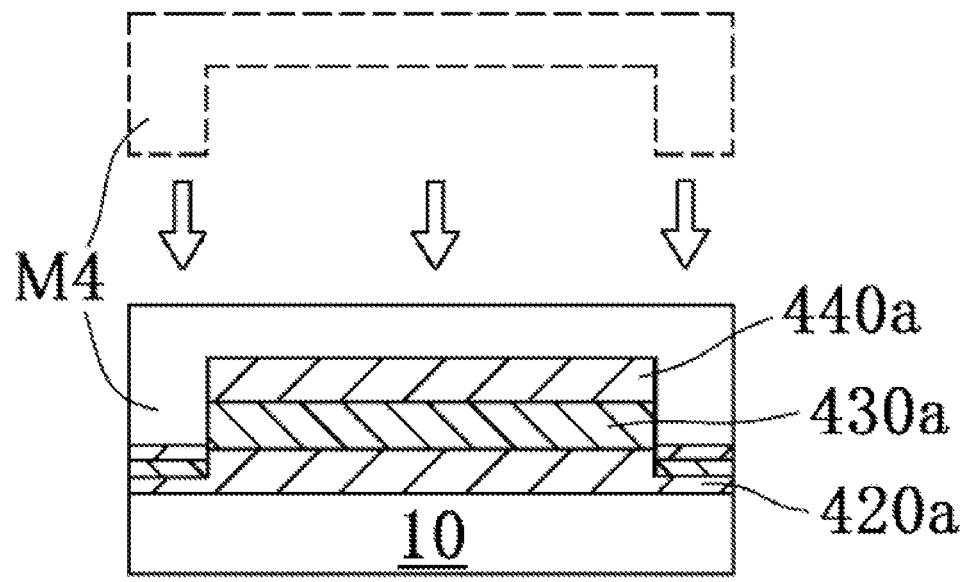
FIG. 23 is a sectional schematic view of a process in the method of producing the thin film capacitor according to the fourth embodiment of the present invention.
Figure 24:
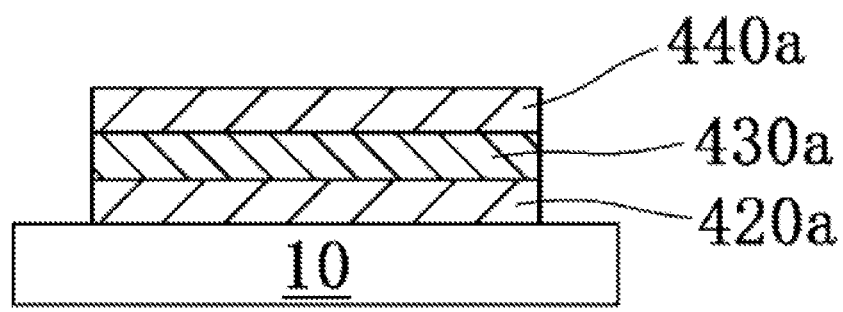
FIG. 24 is a sectional schematic view of a process in the method of producing the thin film capacitor according to the fourth embodiment of the present invention.

Described next is a method of producing the thin film capacitor 400. FIGS. 22 to 24 are sectional schematic views each showing a process in the method of producing the thin film capacitor 400. In order to produce the thin film capacitor 400, initially formed on the substrate 10 is a stacked body including a lower electrode layer precursor layer 420a as a precursor layer of the lower electrode layer 420, a precursor layer 430a of the oxide layer 430, and an upper electrode layer precursor layer 440a as a precursor layer of the upper electrode layer 440. The stacked body is then imprinted and mainly baked. In the steps of producing the thin film capacitor 400, those similar to the steps according to the third embodiment are not described repeatedly.

(1) Formation of Stacked Body Including Precursor Layers

As shown in FIG. 22, initially formed on the substrate 10 is the stacked body including the lower electrode layer precursor layer 420a as a precursor layer of the lower electrode layer 420, the precursor layer 430a of the oxide layer 430, and the upper electrode layer precursor layer 440a as a precursor layer of the upper electrode layer 440. Similarly to the third embodiment, the present embodiment exemplifies a case where each of the lower electrode layer 420 and the upper electrode layer 440 in the thin film capacitor 400 is a conducting oxide layer consisting of lanthanum (La) and nickel (Ni), and the oxide layer 430 serving as an insulating layer consists of bismuth (Bi) and niobium (Nb). Initially formed on the substrate 10 in accordance with the known spin coating technique is the lower electrode layer precursor layer 420a obtained from a lower electrode layer precursor solution as a start material including both a precursor containing lanthanum (La) and a precursor containing nickel (Ni) as solutes. The lower electrode layer precursor layer 420a is then heated in an atmosphere containing oxygen for a predetermined time period at a temperature in the range from 80° C. to 250° C. so as to be preliminarily baked. The formation of the lower electrode layer precursor layer 420a in accordance with the spin coating technique and the preliminary baking are repeated for a plurality of times, so that the lower electrode layer 420 has desired thickness.

The precursor layer 430a is then formed on the lower electrode layer precursor layer 420a having been preliminarily baked. Initially formed on the lower electrode layer precursor layer 420a is the precursor layer 430a obtained from a precursor solution as a start material including both a precursor containing bismuth (Bi) and a precursor containing niobium (Nb) as solutes. The precursor layer 430a is then heated in an atmosphere containing oxygen for a predetermined time period at a temperature in the range from 80° C. to 250° C. so as to be preliminarily baked.

Similarly to the lower electrode layer precursor layer 420a, subsequently formed on the preliminarily baked precursor layer 430a in accordance with the known spin coating technique is the upper electrode layer precursor layer 440a obtained from a precursor solution as a start material including both a precursor containing lanthanum (La) and a precursor containing nickel (Ni) as solutes. The upper electrode layer precursor layer 440a is then heated in an atmosphere containing oxygen at a temperature in the range from 80° C. to 250° C. so as to be preliminarily baked.

(2) Imprinting

As shown in FIG. 23, the imprinting is subsequently performed using a stacked body mold M4 with a pressure from 1 MPa to 20 MPa in the state where the stacked body of the precursor layers (420a, 430a, and 440a) is heated at a temperature in the range from 80° C. to 300° C. so as to pattern the stacked body of the precursor layers (420a, 430a, and 440a).

The stacked body of the precursor layers (420a, 430a, and 440a) is then entirely etched. As shown in FIG. 24, the stacked body of the precursor layers (420a, 430a, and 440a) is thus entirely removed in the regions other than a region corresponding to the lower electrode layer, the oxide layer, and the upper electrode layer (the step of entirely etching the stacked body of the precursor layers (420a, 430a, and 440a)).

(3) Main Baking

The stacked body of the precursor layers (420a, 430a, and 440a) is subsequently mainly baked. As shown in FIG. 25, the lower electrode layer 420, the oxide layer 430, and the upper electrode layer 440 are accordingly formed on the substrate 10.

The solid-state electronic device according to the present embodiment also includes the oxide layer that is formed by heating, in an atmosphere containing oxygen, the precursor layer obtained from the precursor solution as a start material including both the precursor containing bismuth (Bi) and the precursor containing niobium (Nb) as solutes, the oxide layer consisting of bismuth (Bi) and niobium (Nb). Furthermore, the oxide layer is formed by heating at a heating temperature from 520° C. to 650° C. These features lead to preferred electrical properties. Furthermore, the precursor solution for the oxide layer has only to be heated in an atmosphere containing oxygen without adopting the vacuum process. Accordingly, increase in area is facilitated and improvement from the industrial and mass productivity perspectives can be significantly achieved in comparison to the conventional sputtering technique.

In the present embodiment, all the preliminarily baked precursor layers of the oxide layers are imprinted and then mainly baked. It is thus possible to shorten the steps of forming the imprinted structure.

EXAMPLES

Examples and comparative examples are provided to describe the present invention in more detail. The present invention is, however, not limited to these examples.

In each of the examples and comparative examples, measurement of physical properties of a solid-state electronic device and composition analysis of a BNO oxide layer were performed in the following manner.

1. Electrical Properties (1) Leakage Current

The voltage of 0.25 MV/cm was applied between the lower electrode layer and the upper electrode layer to measure current. The measurement was performed using the analyzer 4156C manufactured by Agilent Technologies, Inc.

(2) Dielectric Loss (tan δ)

Dielectric loss in each of the examples and the comparative examples was measured in the following manner. The voltage of 0.1 V or the AC voltage of 1 KHz was applied between the lower electrode layer and the upper electrode layer at a room temperature to measure dielectric loss. The measurement was performed using the broadband permittivity measurement system 1260-SYS manufactured by TOYO Corporation.

(3) Relative Permittivity

Relative permittivity in each of the examples and the comparative examples was measured in the following manner. The voltage of 0.1 V or the AC voltage of 1 KHz was applied between the lower electrode layer and the upper electrode layer to measure relative permittivity. The measurement was performed using the broadband permittivity measurement system 1260-SYS manufactured by TOYO Corporation.

2. Content Percentages of Carbon and Hydrogen in BNO Oxide Layer

Elementary analysis was performed using Pelletron 3SDH manufactured by National Electrostatics Corporation in accordance with the Rutherford backscattering spectrometry (RBS), the Hydrogen Forward scattering Spectrometry (HFS), and the Nuclear Reaction Analysis (NRA), to obtain content percentages of carbon and hydrogen in the BNO oxide layer according to each of the examples and the comparative examples.

3. Crystal Structure Analysis of BNO Oxide Layer by Cross-Sectional TEM Picture and Electron Beam Diffraction The BNO oxide layer according to each of the examples and the comparative examples was observed using a cross-sectional Transmission Electron Microscopy (TEM) picture and an electron beam diffraction image. A Miller index and an interatomic distance were obtained from the electron beam diffraction image of the BNO oxide layer according to each of the examples and the comparative examples, and fitting with a known crystal structure model was performed to analyze the structure. Adopted as the known crystal structure model was $(Bi_{1.5}Zn_{0.5})(Zn_{0.5}Nb_{1.5})O_7$, $\beta$-$BiNbO_4$, or $Bi_3NbO_7$.

Example 1

A thin film capacitor of the example 1 was produced in accordance with the production method of the present embodiment. A lower electrode layer is initially formed on a substrate and an oxide layer is formed subsequently. An upper electrode layer is then formed on the oxide layer. The substrate is made of highly heat resistant glass. The lower electrode layer made of platinum (Pt) was formed on the substrate in accordance with the known sputtering technique. The lower electrode layer was 200 nm thick in this case. Bismuth octylate was used as a precursor containing bismuth (Bi) layer and niobium octylate was used as a precursor containing niobium (Nb) for the oxide layer serving as an insulating. Preliminary baking was performed by heating to 250° C. for five minutes. Formation of a precursor layer in accordance with the spin coating technique and the preliminary baking were repeated for five times. The precursor layer was heated to 520° C. for about 20 minutes in the oxygen atmosphere so as to be mainly baked. The oxide layer 30 was about 170 nm thick. The thickness of each of the layers was obtained as a difference in height between each of the layers and the substrate in accordance with the tracer method. The atomic composition ratio between bismuth (Bi) assumed to be one and niobium (Nb) was 1:1 in the oxide layer. The upper electrode layer made of platinum (Pt) was formed on the oxide layer in accordance with the known sputtering technique. The upper electrode layer in this case was 100 μm×100 μm in size and 150 nm in thickness. Electrical properties exhibited the leakage current value of $3.0 \times 10^{-4}$ A/cm$^2$, the dielectric loss of 0.025, and the relative permittivity of 62. It was possible to obtain, as the composition of crystal phases of the BNO oxide layer, both a fine crystal phase of the pyrochlore crystal structure and a crystal phase of the $\beta$-$BiNbO_4$ crystal structure. More specifically, the pyrochlore crystal structure was found to be either the $(Bi_{1.5}Zn_{0.5})(Zn_{0.5}Nb_{1.5})O_7$ structure or substantially identical with or approximate to the $(Bi_{1.5} Zn_{0.5})(Zn_{0.5}Nb_{1.5})O_7$ structure.

Example 2

A thin film capacitor according to the example 2 was produced under conditions similar to those of the example 1 except that the precursor layer was heated to 520° C. for one hour in the oxygen atmosphere so as to be mainly baked. Electrical properties exhibited the leakage current value of $3.0 \times 10^{-8}$ A/cm$^2$, the dielectric loss of 0.01, and the relative permittivity of 70. It was possible to obtain, as the composition of crystal phases of the BNO oxide layer, both a fine crystal phase of the pyrochlore crystal structure and a crystal phase of the β-BiNbO$_4$ crystal structure. More specifically, the pyrochlore crystal structure was found to be either the $(Bi_{1.5}Zn_{0.5})(Zn_{0.5}Nb_{1.5})O_7$ structure or substantially identical with or approximate to the $(Bi_{1.5}Zn_{0.5})(Zn_{0.5}Nb_{1.5})O_7$ structure. Furthermore, the carbon content percentage had a small value of at most 1.5 atm %, which is not more than the detectable limit. The hydrogen content percentage was 1.6 atm %.

Example 3

A thin film capacitor according to the example 3 was produced under conditions similar to those of the example 1 except that the precursor layer was heated to 530° C. for 20 minutes in the oxygen atmosphere so as to be mainly baked. Electrical properties exhibited the leakage current value of $3.0 \times 10^{-6}$ A/cm$^2$, the dielectric loss of 0.01, and the relative permittivity of 110. It was possible to obtain, as the composition of crystal phases of the BNO oxide layer, both a fine crystal phase of the pyrochlore crystal structure and a crystal phase of the β-BiNbO$_4$ crystal structure. More specifically, the pyrochlore crystal structure was found to be either the $(Bi_{1.5}Zn_{0.5})(Zn_{0.5}Nb_{1.5})O_7$ structure or substantially identical with or approximate to the $(Bi_{1.5}Zn_{0.5})(Zn_{0.5}Nb_{1.5})O_7$ structure.

Example 4

A thin film capacitor according to the example 4 was produced under conditions similar to those of the example 1 except that the precursor layer was heated to 530° C. for two hours in the oxygen atmosphere so as to be mainly baked. Electrical properties exhibited the leakage current value of $8.8 \times 10^{-8}$ A/cm$^2$, the dielectric loss of 0.018, and the relative permittivity of 170. It was possible to obtain, as the composition of crystal phases of the BNO oxide layer, both a fine crystal phase of the pyrochlore crystal structure and a crystal phase of the β-BiNbO$_4$ crystal structure. More specifically, the pyrochlore crystal structure was found to be either the $(Bi_{1.5}Zn_{0.5})(Zn_{0.5}Nb_{1.5})O_7$ structure or substantially identical with or approximate to the $(Bi_{1.5}Zn_{0.5})(Zn_{0.5}Nb_{1.5})O_7$ structure. Furthermore, the carbon content percentage had a small value of at most 1.5 atm %, which is not more than the detectable limit. The hydrogen content percentage was 1.4 atm %.

Example 5

A thin film capacitor according to the example 5 was produced under conditions similar to those of the example 1 except that the precursor layer was heated to 550° C. for one minute in the oxygen atmosphere so as to be mainly baked. Electrical properties exhibited the leakage current value of $5.0 \times 10^{-7}$ A/cm$^2$, the dielectric loss of 0.01, and the relative permittivity of 100. It was possible to obtain, as the composition of crystal phases of the BNO oxide layer, both a fine crystal phase of the pyrochlore crystal structure and a crystal phase of the β-BiNbO$_4$ crystal structure. More specifically, the pyrochlore crystal structure was found to be either the $(Bi_{1.5}Zn_{0.5})(Zn_{0.5}Nb_{1.5})O_7$ structure or substantially identical with or approximate to the $(Bi_{1.5}Zn_{0.5})(Zn_{0.5}Nb_{1.5})O_7$ structure.

Example 6

A thin film capacitor according to the example 6 was produced under conditions similar to those of the example 1 except that the precursor layer was heated to 550° C. for 20 minutes in the oxygen atmosphere so as to be mainly baked. Electrical properties exhibited the leakage current value of $1.0 \times 10^{-6}$ A/cm$^2$, the dielectric loss of 0.001, and the relative permittivity of 180. It was possible to obtain, as the composition of crystal phases of the BNO oxide layer, both a fine crystal phase of the pyrochlore crystal structure and a crystal phase of the β-BiNbO$_4$ crystal structure. More specifically, the pyrochlore crystal structure was found to be either the $(Bi_{1.5}Zn_{0.5})(Zn_{0.5}Nb_{1.5})O_7$ structure or substantially identical with or approximate to the $(Bi_{1.5}Zn_{0.5})(Zn_{0.5}Nb_{1.5})O_7$ structure. Furthermore, the carbon content percentage was at most 1.5 atm % and the hydrogen content percentage was at most 1.0 atm %, each of which had a small value of not more than the detectable limit.

Example 7

A thin film capacitor according to the example 7 was produced under conditions similar to those of the example 1 except that the precursor layer was heated to 550° C. for 12 hours in the oxygen atmosphere so as to be mainly baked. Electrical properties exhibited the leakage current value of $2.0 \times 10^{-5}$ A/cm$^2$, the dielectric loss of 0.004, and the relative permittivity of 100. It was possible to obtain, as the composition of crystal phases of the BNO oxide layer, both a fine crystal phase of the pyrochlore crystal structure and a crystal phase of the β-BiNbO$_4$ crystal structure. More specifically, the pyrochlore crystal structure was found to be either the $(Bi_{1.5}Zn_{0.5})(Zn_{0.5}Nb_{1.5})O_7$ structure or substantially identical with or approximate to the $(Bi_{1.5}Zn_{0.5})(Zn_{0.5}Nb_{1.5})O_7$ structure.

Example 8

A thin film capacitor according to the example 8 was produced under conditions similar to those of the example 1 except that the precursor layer was heated to 600° C. for 20 minutes in the oxygen atmosphere so as to be mainly baked. Electrical properties exhibited the leakage current value of $7.0 \times 10^{-6}$ A/cm$^2$, the dielectric loss of 0.001, and the relative permittivity of 80. It was possible to obtain, as the composition of a crystal phase of the BNO oxide layer, a crystal phase of the β-BiNbO$_4$ crystal structure.

Example 9

A thin film capacitor according to the example 9 was produced under conditions similar to those of the example 1 except that the precursor layer was heated to 650° C. for 20 minutes in the oxygen atmosphere so as to be mainly baked. Electrical properties exhibited the leakage current value of $5.0 \times 10^{-3}$ A/cm$^2$, the dielectric loss of 0.001, and the relative permittivity of 95. It was possible to obtain, as the composition of a crystal phase of the BNO oxide layer, a crystal phase of the β-BiNbO$_4$ crystal structure.

Example 10

A thin film capacitor according to the example 10 was produced in accordance with the production method of the fourth embodiment. The substrate 10 is made of highly heat resistant glass. Each of lower and upper electrode layers was an oxide layer containing lanthanum (La) and nickel (Ni). Lanthanum acetate was used as a precursor containing lanthanum (La) for each of the lower and upper electrode layers. An oxide layer consisting of bismuth (Bi) and niobium (Nb) was formed as an oxide layer serving as an insulating layer. Bismuth octylate was used as a precursor containing bismuth (Bi) and niobium octylate was used as a precursor containing niobium (Nb) for the oxide layer. A precursor layer of the lower electrode layer was initially formed on the substrate and was preliminarily baked. The preliminary baking was performed by heating to 250° C. for about five minutes. The formation of the precursor layer in accordance with the spin coating technique and the preliminary baking were repeated for five times. A precursor layer of the oxide layer serving as an insulating layer was subsequently formed on the precursor layer of the lower electrode layer and was heated to 250° C. for about five minutes so as to be preliminarily baked. A precursor layer of the upper electrode layer was then formed on the precursor layer of the oxide layer serving as an insulating layer under conditions similar to those for the precursor layer of the lower electrode layer. The preliminary baking was subsequently performed by heating to 150° C. for about five minutes. The formation of the precursor layer in accordance with the spin coating technique and the preliminary baking were repeated for five times. A stacked body of these precursor layers was then heated to 650° C. for 20 minutes in an atmosphere containing oxygen so as to be mainly baked. The oxide layer serving as an insulating layer was 170 nm thick. The atomic composition ratio between bismuth (Bi) assumed to be one and niobium (Nb) was 1:1 in the oxide layer serving as an insulating layer. The upper electrode layer and the lower electrode layer were about 60 nm thick. The upper electrode layer in this case was 100 μm×100 μm in size. Electrical properties exhibited the leakage current value of $2.4\times10^{-5}$ A/cm$^2$, the dielectric loss of 0.015, and the relative permittivity of 120. It was possible to obtain, as the composition of a crystal phase of the BNO oxide layer, a crystal phase of the β-BiNbO$_4$ crystal structure.

Comparative Example 1

A thin film capacitor according to the comparative example 1 was produced under conditions similar to those of the example 1 except that the precursor layer was heated to 500° C. for 20 minutes in the oxygen atmosphere so as to be mainly baked. Electrical properties exhibited the leakage current value as large as $1.0\times10^{-2}$ A/cm$^2$, the dielectric loss of 0.001, and the relative permittivity of 100. It was possible to obtain, as the composition of crystal phases of the BNO oxide layer, both a fine crystal phase of the pyrochlore crystal structure and a crystal phase of the β-BiNbO$_4$ crystal structure.

Comparative Example 2

A thin film capacitor according to the comparative example 2 was produced under conditions similar to those of the example 1 except that the precursor layer was heated to 500° C. for two hours in the oxygen atmosphere so as to be mainly baked. Electrical properties exhibited the leakage current value as large as $1.0\times10^{-1}$ A/cm$^2$, the dielectric loss of 0.007, and the relative permittivity of 180. It was possible to obtain, as the composition of crystal phases of the BNO oxide layer, both a fine crystal phase of the pyrochlore crystal structure and a crystal phase of the β-BiNbO$_4$ crystal structure. Furthermore, the carbon content percentage was 6.5 atm % and the hydrogen content percentage was 7.8 atm %, each of which had a large value.

Comparative Example 3

In the comparative example 3, a BNO oxide layer serving as an insulating layer was formed on a lower electrode layer at a room temperature in accordance with the known sputtering technique, and was then heat treated at 550° C. for 20 minutes. A thin film capacitor was produced under conditions similar to those of the example 1, except for the above condition. Electrical properties exhibited the leakage current value of $1.0\times10^{-7}$ A/cm$^2$, the dielectric loss of 0.005, and the relative permittivity of 50. It was possible to obtain, as the composition of a crystal phase of the BNO oxide layer, a fine crystal phase of the Bi$_3$NbO$_7$ crystal structure. Furthermore, the carbon content percentage was at most 1.5 atm % and the hydrogen content percentage was at most 1.0 atm %, each of which had a small value of not more than the detectable limit.

Tables 2 and 3 indicate the configuration of the thin film capacitor, the conditions for forming the oxide layer, the obtained electrical properties, the content percentages of carbon and hydrogen in the BNO oxide layer, and the result of the crystal structure in each of the examples 1 to 10 and the comparative examples 1 to 3. The "composition of crystal phases" in Tables 2 and 3 includes a crystal phase and a fine crystal phase. BiNbO$_4$ in Tables 2 and 3 indicates β-BiNbO$_4$.

| Processing conditions and measurement results | Example | | | | | | | | | |
|---|---|---|---|---|---|---|---|---|---|---|
| | 1 | 2 | 3 | 4 | 5 | 6 | 7 | 8 | 9 | 10 |
| Process | Solution technique | Solution technique | Solution technique | Solution technique | Solution technique | Solution technique | Solution technique | Solution technique | Solution technique | Solution technique |
| Main baking temperature | 520 | 520 | 530 | 530 | 550 | 550 | 550 | 600 | 650 | 650 |
| Main baking period | 20 minutes | 1 hour | 20 minutes | 2 hour | 1 minutes | 20 minutes | 12 hour | 20 minutes | 20 minutes | 20 minutes |
| Electrode layer | Platinum layer | Platinum layer | Platinum layer | Platinum layer | Platinum layer | Platinum layer | Platinum layer | Platinum layer | Platinum layer | Platinum layer |
| Dielectric loss (1 KHz) | 0.025 | 0.01 | 0.01 | 0.018 | 0.01 | 0.001 | 0.004 | 0.001 | 0.001 | 0.015 |

-continued

| Processing conditions and measurement results | Example | | | | | | | | | |
|---|---|---|---|---|---|---|---|---|---|---|
| | 1 | 2 | 3 | 4 | 5 | 6 | 7 | 8 | 9 | 10 |
| Leakage current (A/cm$^2$) (0.25 MV/cm) | $3.0 \times 10^{-4}$ | $3.0 \times 10^{-8}$ | $3.0 \times 10^{-6}$ | $8.8 \times 10^{-8}$ | $5.0 \times 10^{-7}$ | $1.0 \times 10^{-6}$ | $2.0 \times 10^{-5}$ | $7.0 \times 10^{-6}$ | $5.0 \times 10^{-3}$ | $2.4 \times 10^{-5}$ |
| Relative permittivity (1 KHz) | 62 | 70 | 110 | 170 | 100 | 180 | 100 | 80 | 95 | 120 |
| Carbon content percentage (atm %) | — | At most 1.5 | — | At most 1.5 | — | At most 1.5 | — | — | — | — |
| Hydrogen content percentage (atm %) | — | 1.6 | — | 1.4 | — | At most 1.0 | — | — | — | — |
| Composition of crystal phases | BiNbO$_4$ Bi$_2$Nb$_2$O$_7$ | BiNbO$_4$ Bi$_2$Nb$_2$O$_7$ | BiNbO$_4$ Bi$_2$Nb$_2$O$_7$ | BiNbO$_4$ Bi$_2$Nb$_2$O$_7$ | BiNbO$_4$ Bi$_2$Nb$_2$O$_7$ | BiNbO$_4$ Bi$_2$Nb$_2$O$_7$ | BiNbO$_4$ Bi$_2$Nb$_2$O$_7$ | BiNbO$_4$ | BiNbO$_4$ | BiNbO$_4$ |

TABLE 3

| Processing conditions and measurement results | Comparative examples | | |
|---|---|---|---|
| | 1 | 2 | 3 |
| Process | Solution technique | Solution technique | Sputtering technique |
| Main baking temperature | 500 | 500 | — |
| Main baking period | 20 minutes | 2 hour | — |
| Electrode layer | Platinum layer | Platinum layer | Platinum layer |
| Dielectric less (1 KHz) | 0.001 | 0.007 | 0.005 |
| Leakage current (A/cm2) (0.25 KV/cm) | $1.0 \times 10^{-2}$ | $1.0 \times 10^{-1}$ | $1.0 \times 10^{-7}$ |
| Relative permittivity (1 KHz) | 100 | 180 | 50 |
| Carbon content percentage (atm %) | — | 6.5 | At most 1.5 |
| Hydrogen content percentage (atm %) | — | 7.8 | At most 1.0 |
| Composition of crystal phases | BiNbO$_4$ Bi$_2$Nb$_2$O$_7$ | BiNbO$_4$ Bi$_2$Nb$_2$O$_7$ | Bi$_3$NbO$_7$ |

1. Electrical Properties
(1) Leakage Current

As indicated in Tables 2 and 3, in each of the examples, the leakage current value upon application of 0.25 MV/cm was at most $5.0 \times 10^{-3}$ A/cm$^2$ and the thin film capacitor exhibited sufficient properties as a capacitor. The leakage current in each of the examples was lower than those of the comparative examples 1 and 2. It was found that a preferred value was obtained when the heating temperature for forming the oxide layer was set in the range from 520° C. to 650° C. Furthermore, the obtained result was similar to that of the BNO layer formed in accordance with the sputtering technique in the comparative example 3.

(2) Dielectric Loss (tan δ)

As indicated in Tables 2 and 3, in each of the examples, the dielectric loss at 1 KHz was at most 0.03 and the thin film capacitor exhibited sufficient properties as a capacitor. The oxide layer according to each of the examples is formed by baking a precursor solution including both a precursor containing bismuth (Bi) and a precursor containing niobium (Nb) as solutes. In this application, the above method of forming the oxide layer or a different oxide layer by baking a precursor solution as a start material is also called the "solution technique" for the convenience purpose. An oxide layer formed in accordance with the solution technique is a preferred insulating layer also in view of small dielectric loss. Even having the same composition, the oxide layer according to each of the examples exhibited a result similar to that of the BNO layer formed in accordance with the sputtering technique in the comparative example 3.

(3) Relative Permittivity

As indicated in Tables 2 and 3, in each of the examples, the relative permittivity at 1 KHz was at least 60 and the thin film capacitor exhibited sufficient properties as a capacitor. In contrast, the BNO layer having the Bi$_3$NbO$_7$ crystal structure in the comparative example 3 exhibited the relative permittivity as low as 50.

2. Content Percentages of Carbon and Hydrogen in BNO Oxide Layer

In each of the examples 2, 4, and 6 in which the main baking temperature was in the range from 520° C. to 650° C., the BNO oxide layer had a preferred carbon content percentage of at most 1.5 atm %. The carbon content percentage obtained in accordance with this measurement technique has a lower limit measurement value of about 1.5 atm %, so that the actual concentration is assumed to be at most the lower limit measurement value. It was also found that the carbon content percentage in each of these examples was at a level similar to that of the BNO oxide layer formed in accordance with the sputtering technique in the comparative example 3. When the main baking temperature is as low as 500° C. as in the comparative example 2, carbon in the solvent and the solute in the precursor solution is assumed to remain. The carbon content percentage had the value as large as 6.5 atm %. It is regarded that the leakage current thus had the value as large as $1.0 \times 10^{-1}$ A/cm$^2$.

In each of the examples 2, 4, and 6 in which the main baking temperature was in the range from 520° C. to 650° C., the BNO oxide layer had a preferred hydrogen content percentage of at most 1.6 atm %. The hydrogen content percentage obtained in accordance with this measurement technique has a lower limit measurement value of about 1.0 atm %, so that the actual concentration in the example 6 is assumed to be at most the lower limit measurement value. It was also found that the hydrogen content percentage in the example 6 was at a level similar to that of the BNO oxide layer formed in accordance with the sputtering technique in the comparative example 3. When the main baking temperature is as low as 500° C. as in the comparative example 2, hydrogen in the solvent and the solute in the precursor solution is assumed to remain. The hydrogen content percentage had the value as large as 7.8 atm %. Such a large hydrogen content percentage is possibly a reason why the leakage current had the value as large as $1.0 \times 10^{-1}$ A/cm$^2$.

Figure 26:
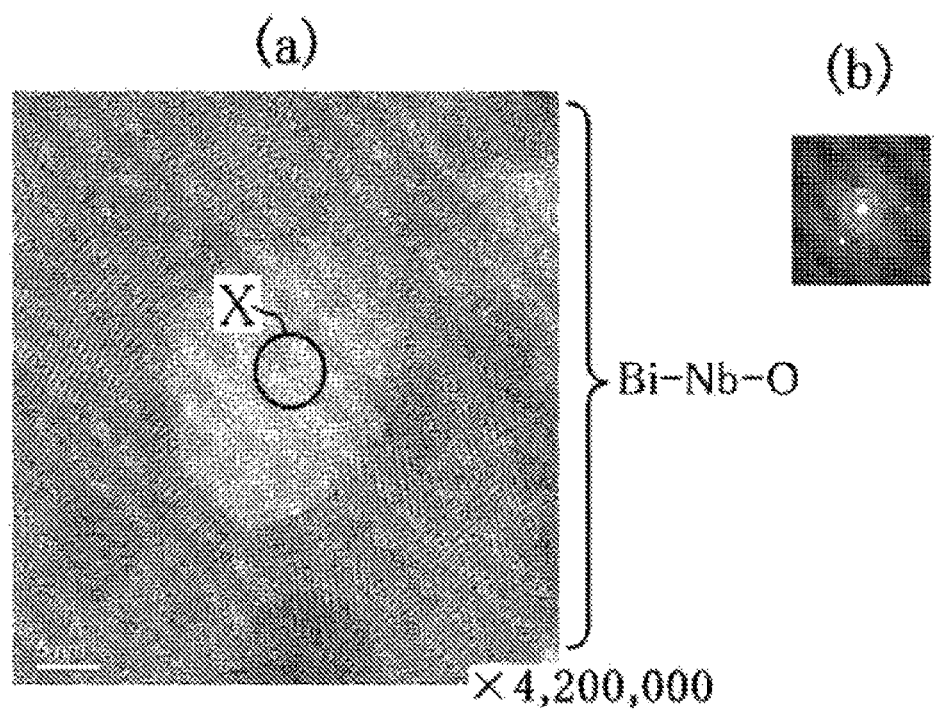
FIGS. 26(a) and 26(b) are a cross-sectional TEM picture and an electron beam diffraction image each showing a crystal structure of an oxide layer serving as an insulating layer in the first embodiment of the present invention.
Figure 27:
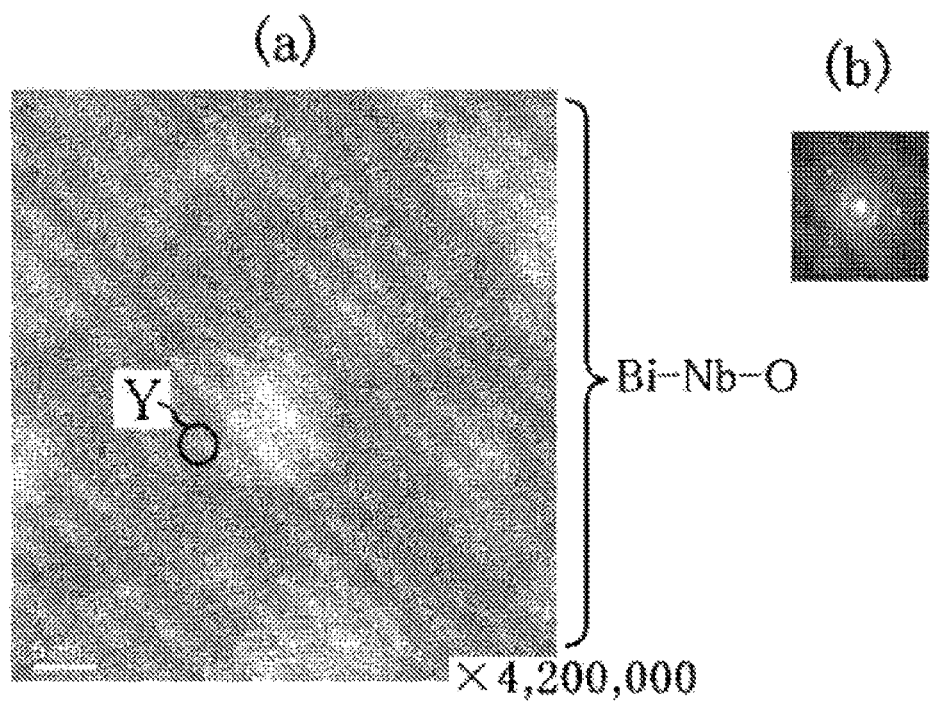
FIGS. 27(a) and 27(b) are a cross-sectional TEM picture and an electron beam diffraction image each showing a crystal structure of an oxide layer serving as an insulating layer in a comparative example.

3. Crystal Structure Analysis by Cross-Sectional TEM Picture and Electron Beam Diffraction FIGS. 26(a) and 26(b) are a cross-sectional TEM picture and an electron beam diffraction image each showing the crystal structure of the BNO oxide layer according to the example 6. FIG. 26(a) is the cross-sectional TEM picture of the BNO oxide layer according to the example 6. FIG. 26(b) is the electron beam diffraction image in a region X in the cross-sectional TEM picture of the BNO oxide layer shown in FIG. 26(a). FIGS. 27(a) and 27(b) are a cross-sectional TEM picture and an electron beam diffraction image each showing the crystal structure of the oxide layer serving as an insulating layer in the comparative example 3. FIG. 27(a) is a cross-sectional TEM picture showing the crystal structure of the BNO oxide layer according to the example 3. FIG. 27(b) is the electron beam diffraction image in a region Y in the cross-sectional TEM picture of the BNO oxide layer shown in FIG. 27(a). From the cross-sectional TEM picture and the electron beam diffraction image shown in FIGS. 26(a) and 26(b), it was found that the BNO oxide layer according to the present example included a crystal phase and an amorphous phase. More particularly, the BNO oxide layer was found to include a crystal phase, a fine crystal phase, and an amorphous phase. The "fine crystal phase" in this application means a crystal phase that is not uniformly grown from the upper end to the lower end in the thickness direction of a layered material. Furthermore, fitting with a known crystal structure model in accordance with a Miller index and an interatomic distance indicated that the BNO oxide layer had at least one of a fine crystal phase of the pyrochlore crystal structure expressed by a general formula of $A_2B_2O_7$ (where A is a metal element and B is a transition metal element; this applies hereinafter) and a crystal phase of the triclinic $\beta$-$BiNbO_4$ crystal structure.

The fine crystal phase of the pyrochlore crystal structure and the crystal phase of the $\beta$-$BiNbO_4$ crystal structure have different appearance depending on the main baking temperature for the precursor layer of the oxide layer serving as an insulating layer. As in the examples 8 to 10, it was possible to obtain a crystal phase of the $\beta$-$BiNbO_4$ crystal structure when the main baking temperature was 600° C. and 650° C. As in the examples 1 to 7, it was possible to obtain both a fine crystal phase of the pyrochlore crystal structure and a crystal phase of the $\beta$-$BiNbO_4$ crystal structure when the main baking temperature was 520° C., 530° C., and 550° C. More specifically, it was found that the pyrochlore crystal structure was either the $(Bi_{1.5}Zn_{0.5})(Zn_{0.5}Nb_{1.5})O_7$ structure or substantially identical with or approximate to the $(Bi_{1.5}Zn_{0.5})(Zn_{0.5}Nb_{1.5})O_7$ structure and the pyrochlore crystal structure thus configured exerted preferred electrical properties as an insulating layer of a thin film capacitor. As in the examples 1 to 7, it was found that the oxide layer serving as an insulating layer had both a fine crystal phase of the pyrochlore crystal structure and a crystal phase of the $\beta$-$BiNbO_4$ crystal structure and thus exhibited preferred relative permittivity as an insulating layer of a solid-state electronic device.

In contrast, the oxide layer formed in accordance with the sputtering technique in the comparative example 3 had neither a fine crystal phase of the pyrochlore crystal structure nor a crystal phase of the $\beta$-$BiNbO_4$ crystal structure, but had a fine crystal phase of the $Bi_3NbO_7$ crystal structure.

As described above, the solid-state electronic device according to each of the embodiments is produced in accordance with the solution technique and includes the BNO oxide layer obtained by heating at the heating temperature (the main baking temperature) for forming the oxide layer in the range from 520° C. to 650° C. The solid-state electronic device thus produced has the preferred electrical properties of high relative permittivity and small dielectric loss. Furthermore, the solid-state electronic device is produced in accordance with a simple method in a relatively short time period with no need for complex and expensive equipment such as a vacuum system. These features remarkably contribute to provision of an excellent solid-state electronic device from the industrial and mass productivity perspectives.

Other Embodiments

The embodiments of the present invention have been described above, although the present invention is not limited to the contents described above.

The solid-state electronic device according to each of the embodiments is suitable for control of large current with low drive voltage. The solid-state electronic device according to each of the embodiments can include, in addition to the thin film capacitor, a capacitor such as a stacked thin film capacitor or a variable capacity thin film capacitor, a metal oxide semiconductor field effect transistor (MOSFET), a semiconductor device such as a nonvolatile memory, a micro total analysis system (TAS), and a micro electric mechanical system (MEMS) device such as a micro chemical chip or a DNA chip.

As described above, the above embodiments have been disclosed not for limiting the present invention but for describing these embodiments. Furthermore, modification examples made within the scope of the present invention, inclusive of other combinations of the embodiments, will be also included in the scope of the patent claims.

The invention claimed is:

1. A solid-state electronic device comprising:
an oxide layer that is formed by heating, in an atmosphere containing oxygen, a precursor layer obtained from a precursor solution as a starting material including both a precursor containing bismuth (Bi) and a precursor containing niobium (Nb) as solutes, the oxide layer consisting essentially of the bismuth (Bi) and the niobium (Nb); wherein
the oxide layer has a crystal phase of a pyrochlore crystal structure.

2. The solid-state electronic device according to claim 1, wherein
the oxide layer has a carbon content percentage of at most 1.5 atm %.

3. The solid-state electronic device according to claim 1, wherein
the precursor layer is provided with an imprinted structure by imprinting the precursor layer while the precursor layer is heated at a temperature from 80° C. to 300° C. in an atmosphere containing oxygen before the oxide layer is formed.

4. The solid-state electronic device according to claim 3, wherein
the imprinting is performed with a pressure in a range from 1 MPa to 20 MPa.

5. The solid-state electronic device according to claim 3, wherein
the imprinting is performed using a mold that is preliminarily heated to a temperature in a range from 80° C. to 300° C.

6. The solid-state electronic device according to claim 1, wherein the solid-state electronic device is a capacitor.

7. A solid-state electronic device comprising:
an oxide layer that is formed by heating, in an atmosphere containing oxygen, a precursor layer obtained from a precursor solution as a starting material including both a precursor containing bismuth (Bi) and a precursor containing niobium (Nb) as solutes, the oxide layer consisting of the bismuth (Bi) and the niobium (Nb); wherein the oxide layer has a crystal phase of a pyrochlore crystal structure.

8. The solid-state electronic device according to claim 7, wherein
the precursor layer is provided with an imprinted structure by imprinting the precursor layer while the precursor layer is heated at a temperature from 80° C. to 300° C. in an atmosphere containing oxygen before the oxide layer is formed.

9. The solid-state electronic device according to claim 8, wherein
the imprinting is performed with a pressure in a range from 1 MPa to 20 MPa.

10. The solid-state electronic device according to claim 8, wherein
the imprinting is performed using a mold that is preliminarily heated to a temperature in a range from 80° C. to 300° C.

11. The solid-state electronic device according to claim 7, wherein the solid-state electronic device is a capacitor.

* * * * *